(12) United States Patent
Hirose

(10) Patent No.: US 7,768,312 B2
(45) Date of Patent: Aug. 3, 2010

(54) SEMICONDUCTOR DEVICE AND DRIVER CONTROL METHOD

(75) Inventor: Yukitoshi Hirose, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/285,979

(22) Filed: Oct. 17, 2008

(65) Prior Publication Data

US 2009/0102511 A1 Apr. 23, 2009

(30) Foreign Application Priority Data

Oct. 18, 2007 (JP) .............................. P2007-271144

(51) Int. Cl.
*H03K 19/094* (2006.01)
(52) U.S. Cl. .......................................... 326/87; 326/83
(58) Field of Classification Search ................... 326/26, 326/27, 30, 83–87
See application file for complete search history.

(56) References Cited

U.S. PATENT DOCUMENTS

| | | | |
|---|---|---|---|
| 6,704,818 B1 * | 3/2004 | Martin et al. ............... | 710/100 |
| 7,212,035 B2 * | 5/2007 | Dreps et al. ................ | 326/83 |
| 7,215,144 B2 * | 5/2007 | Mitby et al. ................ | 326/82 |
| 7,239,169 B2 | 7/2007 | Isa et al. | |
| 7,307,447 B2 * | 12/2007 | Clements et al. ........... | 326/30 |
| 7,363,595 B2 * | 4/2008 | Levin et al. ................. | 716/1 |
| 2003/0052345 A1 | 3/2003 | Isa et al. | |

FOREIGN PATENT DOCUMENTS

JP 2003-069413 3/2003

* cited by examiner

*Primary Examiner*—Don P Le
(74) *Attorney, Agent, or Firm*—McGinn IP Law Group, PLLC

(57) ABSTRACT

A semiconductor device of the invention has a plurality of P-channel transistors, to which resistance elements are inserted in series, prepared on a pull-up side of a driver such that an ON resistance value on the P-channel transistor side and a resistance value of the resistance element can be selected. In addition, also on a pull-down side of the driver, a plurality of N-channel transistors to which resistance elements are inserted in series are prepared such that an ON resistance value on the N-channel transistor side and a resistance value of the resistance element can be selected. A driver section having a linear current-voltage characteristic is realized by combination of those described.

5 Claims, 10 Drawing Sheets

SEMICONDUCTOR DEVICE AND DRIVER CONTROL METHOD

BACKGROUND OF THE INVENTION

1. Field of the Invention

The present invention relates to a semiconductor device having a driver section for transmitting data to a data transmission line and a driver control method. In particular, the invention relates to improving a transmission characteristic by providing a driver with a linear current-voltage (I-V) characteristic in the interface having power supply termination (method of pulling up a power supply with a resistor at the end of a transmission line). Furthermore, the invention relates to a semiconductor device which can allow a driver with a linear I-V characteristic to be adapted to various conditions, and a driver section control method.

Priority is claimed on Japanese Patent Application No. 2007-271144, filed Oct. 18, 2007, the content of which is incorporated herein by reference.

2. Description of Related Art

In recent years, there has been a case in which power supply termination of a transmission line is performed to prevent deterioration of the waveform quality caused by reflection as the operation speed increases. As shown in FIG. 6, in the case of transmitting data from a side of a driver 21 to a side of a receiver 22 through a data transmission line 23, Vtt termination is performed by a termination voltage Vtt and a termination resistor Rtt at the side of the receiver 22.

FIGS. 7A and 7B show Eye patterns (eye diagrams) of simulation waveforms in the data transmission line 23. FIG. 7A shows an Eye pattern when a voltage level of the termination voltage Vtt is set to ½ of a power supply voltage VDD. FIG. 7B shows an Eye pattern when the voltage level of the termination voltage Vtt is set to the power supply voltage VDD. Usually, a reference voltage VRef used to determine a low level/high level of a signal is set to a level of ½ of the power supply voltage VDD in such a manner that a 'margin between the low level and the reference voltage VRef' becomes equal to a 'margin between the high level and the reference voltage VRef'.

The signal amplitude at the time of Vtt termination depends on a resistance value of the termination resistor Rtt, and the signal amplitude increases as the resistance value increases. When the Vtt termination is not performed, a signal is fully amplified. As indicated by a simulation result of FIG. 7A, in the case when Vtt termination is performed, it is necessary to make a signal cross point a1 of the Eye pattern equal to the level of the reference voltage VRef. Therefore, it is necessary to make the termination voltage Vtt equal to a level of ½ of the power supply voltage VDD, that is, the level of the reference voltage VRef.

However, a demand for low power consumption in recent portable devices represented as mobile phones has increased. Also in a semiconductor device, it is necessary to reduce a power supply voltage in order to realize low power consumption. In addition, from a point of view of an improvement in signal processing speed and the like, a demand for an increase in signal speed has also increased. For this reason, it is necessary to realize both the low voltage and the high speed.

As the power supply voltage decreases, the reference voltage VRef also decreases. Taking the sensitivity, operation speed, and the like of a receiver into consideration, a possibility that the low voltage and the high speed will be realized increases if a level of the reference voltage VRef can be made higher than a level of ½ of the power supply voltage VDD. Under such a background, when the Vtt level of Vtt termination is made equal to the power supply voltage, the Eye pattern shifts to a side of the power supply voltage VDD (upper side in the drawing) as indicated by the simulation result of FIG. 7B. As a result, the level of the reference voltage VRef can be set higher than the level of ½ of the power supply voltage VDD.

The simulation results shown in FIGS. 7A and 7B are obtained by modeling a driver section model as ON resistance of a transistor. Accordingly, those simulation results are results when a relationship (I-V characteristic) between a current and a voltage on the pull-up/pull-down side of the driver section has a linear characteristic. However, since an I-V characteristic of an actual transistor shows a characteristic having a non-saturation region and a saturation region, the I-V characteristic does not always have a linear characteristic. These characteristics are shown in FIG. 8. It is revealed that a pull-up current and a pull-down current increase with decreasing the ON resistance of the transistor (with increasing a gate width of the transistor) while the pull-up current and the pull-down current decrease with increasing the ON resistance of the transistor (with decreasing the gate width of the transistor).

As is apparent from the simulation results, a steady state of a high level is set to a level equal to the power supply voltage when the Vtt level is made equal to the power supply voltage VDD. It is necessary to decide a resistance value of the termination resistor Rtt and an ON resistance value of a driver transistor in such a manner that the 'margin between the low level and the reference voltage VRef' becomes equal to the 'margin between the high level and the reference voltage VRef'.

Here, a 'transistor model' in which the ON resistance of a driver transistor is added at a level (FIG. 8; a point a2 shown by O) of ½ of the power supply voltage VDD is considered. This is set such that a voltage-divided level by the ON resistance on the pull-up side and the pull-down side becomes a ½ VDD level. Using the 'transistor model' and a 'resistance element model' modeled as the ON resistance, simulation results when the Vtt level is made equal to the power supply voltage VDD are shown in FIG. 9.

FIG. 9A shows an Eye pattern when the 'resistance element model' is used. FIG. 9B shows an Eye pattern of the 'transistor model'. In the Eye pattern of the 'resistance element model' shown in FIG. 9A, there is a symmetric property in a signal. In the 'transistor model' shown in FIG. 9B, however, there is no symmetric property in the Eye pattern (jitter occurs) and a fluctuation of a waveform in a LOW level is noticeable.

In the simulation results shown in FIG. 9, it can be seen that the stability in a steady state of the low level is reduced in a driver section with a nonlinear I-V characteristic.

In this case, the low level in a steady state can be appropriately set by making a resistance value of the termination resistor Rtt small. The simulation results are shown in FIGS. 10A and 10B. FIG. 10A shows an Eye pattern when the 'resistance element model' is used. FIG. 10B shows an Eye pattern when the transistor model' is used.

The simulation result of the transistor model shown in FIG. 10B clearly indicates the following points. Even in a case where the resistance value of the termination resistor Rtt is made small, the symmetric property of the Eye pattern is lost in a driver section with a nonlinear I-V characteristic. This causes a problem in that the window width on the low side becomes narrow. The reason is clear from operating points of pull-up (P-channel transistor)/pull-down (N-channel transistor) of the driver section. FIG. 2 shows a view regarding operating points of P-channel (Pch) transistor and N-channel (Nch) transistor.

FIG. 2 shows a case where the termination voltage Vtt is made equal to the power supply voltage VDD in a driver section with a nonlinear I-V characteristic. As is apparent from FIG. 2, the operating point of the pull-up (Pch transistor) of the driver section is mainly positioned in a range lower than an ON resistance value targeted. The operating point of the pull-down (Nch transistor) is mainly positioned in a range higher than the ON resistance value targeted. This causes the symmetric property of the Eye pattern to disappear.

In order to solve the problem described so far, a driver section having a linear I-V characteristic with an ON resistance value allowing the 'margin between the low level and the reference voltage VRef' to become equal to the 'margin between the high level and the reference voltage VRef' in consideration of the resistance value of the termination resistor Rtt and the level of the reference voltage VRef is needed.

As another problem, the resistance value of the termination resistor Rtt changes according to a condition of connection between the driver section and the receiver in order to reduce an influence of reflection. In addition, the level of the reference voltage VRef also changes with the design of the receiver. For this reason, the target ON resistance value of the driver section suitable for them also changes. Therefore, it becomes necessary to be able to adjust the target ON resistance value of the driver section.

There is a known semiconductor device which is related with the invention (for example, refer to Japanese Unexamined Patent Application, First Publication, No. 2003-69413). In this semiconductor device, the output impedance of a driver section is equal to the characteristic impedance of a signal line in a system in which there is no termination resistance element on the receiver side. Thus, a technique of determining the ON resistance Rs of a transistor and realizing the linearity is disclosed.

However, the above reference is silent about a semiconductor device whose termination resistance element is present on the receiver side. Particularly, the termination resistance element is specialized in a system depending on the VDD. That is, the known technique does not disclose any semiconductor device whose output impedance of a driver section does not need to be made to match the characteristic impedance of a signal line.

As described above, in the driver section of the semiconductor device, there is needed a driver section having a linear I-V characteristic with an ON resistance value allowing the 'margin between the low level and the reference voltage VRef' to become equal to the 'margin between the high level and the reference voltage VRef' in consideration of the resistance value of the termination resistor Rtt and the level of the reference voltage VRef.

As another problem, the resistance value of the termination resistor Rtt changes according to a condition of connection between the driver section and the receiver in order to reduce an influence of reflection, and the level of the reference voltage VRef also changes with design of the receiver. The target ON resistance value of the driver section suitable for them also changes. Therefore, it becomes necessary to be able to adjust the target ON resistance value of the driver section.

SUMMARY

The present invention seeks to solve one or more of the above problems, or to improve those problems at least in part.

An advantage of some aspects of the invention is to provide a semiconductor device and a driver control method capable of improving a signal transmission characteristic and making a control such that a driver section with a linear I-V characteristic can be adapted to various conditions by providing the driver section with a linear I-V characteristic as a driver section (driver section for driving a data transmission line) of a semiconductor device.

In one embodiment, there is provided a semiconductor device that includes a driver section for transmitting data to a data transmission line in which power supply termination is made. The driver section includes: a plurality of transistors which are provided on a pull-up side and have different ON resistance values to drive the data transmission line in a high level; a plurality of resistance elements which are provided on the pull-up side and each of which is connected in series to each of the transistors and has one end connected to an output side of the transistor and the other end connected to the data transmission line; a plurality of transistors which are provided on a pull-down side and have different ON resistance values to drive the data transmission line in a low level; a plurality of resistance elements which are provided on the pull-down side and each of which is connected in series to each of the transistors and has one end connected to an output side of the transistor and the other end connected to the data transmission line; and a driving transistor selecting section which selects any of the plurality of transistors on each of the pull-up side and the pull-down side.

In one embodiment, there is provided a driver control method in a semiconductor device having a driver section for transmitting data to a data transmission line in which power supply termination is made includes: performing a procedure of providing a plurality of transistors, which have different ON resistance values to drive the data transmission line in a high level, and a plurality of resistance elements, each of which is connected in series to each of the transistors and has one end connected to an output side of the transistor and the other end connected to the data transmission line, on a pull-up side; performing a procedure of providing a plurality of transistors, which have different ON resistance values to drive the data transmission line in a low level, and a plurality of resistance elements, each of which is connected in series to each of the transistors and has one end connected to an output side of the transistor and the other end connected to the data transmission line, on a pull-down side; and performing a driving transistor selection procedure of selecting any of the plurality of transistors on each of the pull-up side and the pull-down side.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Next, embodiments of the invention will be described in detail with reference to the accompanying drawings.

While preferred embodiments of the invention will be described and illustrated below, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

First Embodiment

Figure 1:
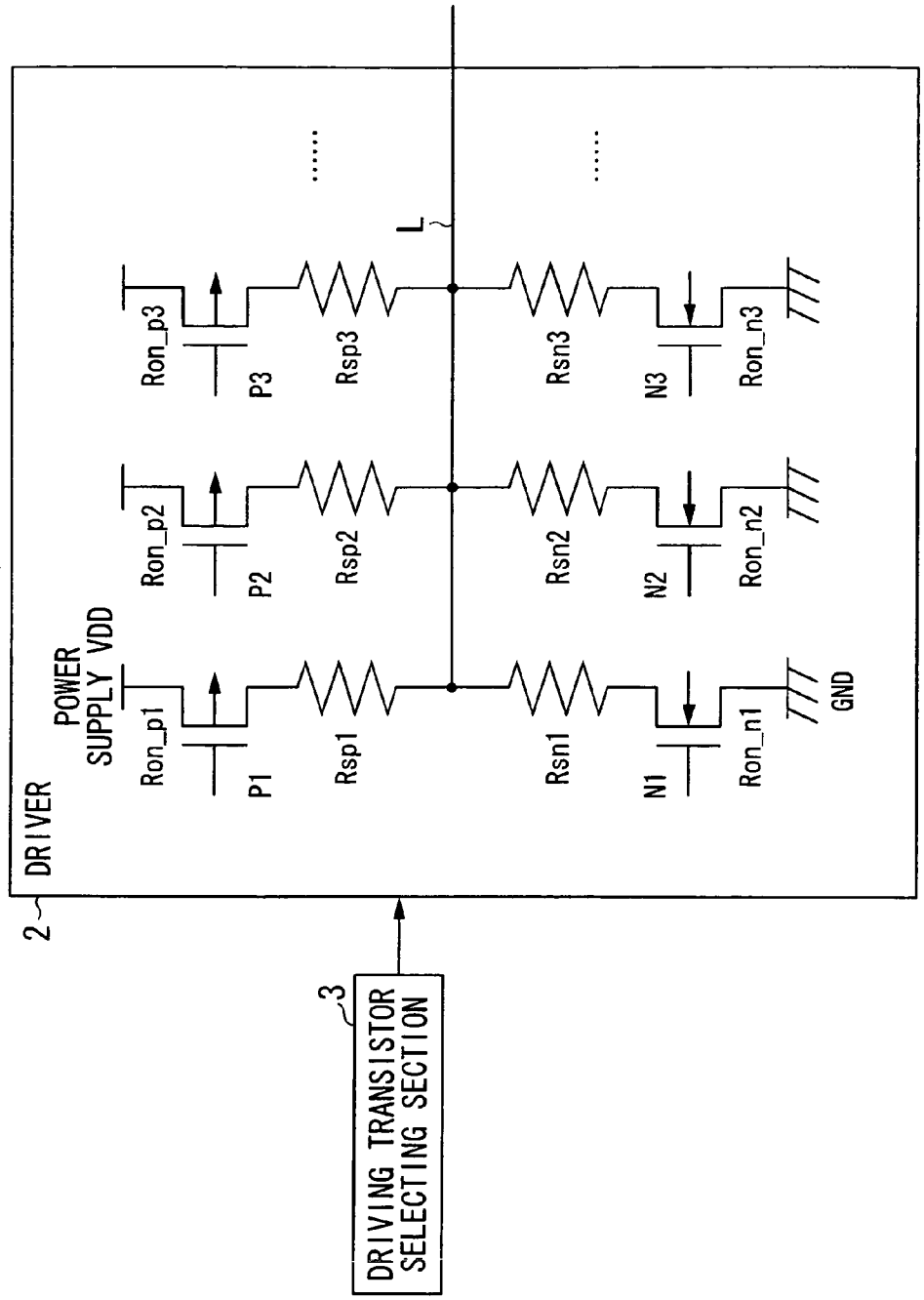
FIG. 1 is a circuit diagram showing a configuration of a semiconductor device according to a first embodiment of the present invention.

FIG. 1 is a view showing the configuration of a semiconductor device according to a first embodiment of the invention and is a view showing the configuration of a driver section.

As shown in FIG. 1, a driver section 1 is configured to include a driver 2 and a driving transistor selecting section 3. The driver 2 is configured to include Pch transistors (Pch MOSFETs) P1, P2, and P3 on the pull-up side and Nch transistors (Nch MOSFETs) N1, N2, and N3 on the pull-down side. The Pch transistors P1, P2, and P3 are Pch transistors having different ON resistance values (may have the same ON resistance value). The Nch transistors N1, N2, and N3 are Nch transistors having different ON resistance values (may have the same ON resistance value).

Sources of the Pch transistors P1, P2, and P3 on the pull-up side are connected to a power supply VDD, and sources of the Nch transistor N1, N2, and N3 on the pull-down side are connected to the ground (GND).

A resistance element Rsp1 and a resistance element Rsn1 are inserted in series between a drain of the Pch transistor P1 and a drain of the Nch transistor N1. A resistance element Rsp2 and a resistance element Rsn2 are inserted in series between a drain of the Pch transistor P2 and a drain of the Nch transistor N2. A resistance element Rsp3 and a resistance element Rsn3 are inserted in series between a drain of the Pch transistor P3 and a drain of the Nch transistor N3.

A connection point of the resistance element Rsp1 and the resistance element Rsn1, a connection point of the resistance element Rsp2 and the resistance element Rsn2, and a connection point of the resistance element Rsp3 and the resistance element Rsn3 are commonly connected. This common connection point is connected to an output signal line L (data transmission line) of the driver section 2.

In the drawing, a reference numeral Ron_p1 denotes an ON resistance value of the Pch transistor P1, a reference numeral Ron_p2 denotes an ON resistance value of the Pch transistor P2, and a reference numeral Ron_p3 denotes an ON resistance of the Pch transistor P3. A reference numeral Ron_n1 denotes an ON resistance value of the Nch transistor N1, a reference numeral Ron_n2 denotes an ON resistance value of the Nch transistor N2, and a reference numeral Ron_n3 denotes an ON resistance of the Nch transistor N3.

The driving transistor selecting section 3 selects a transistor to be driven by arbitrarily changing a gate level of each transistor. This allows an ON resistance value (resistance value obtained by adding ON resistance of a transistor and a resistance element) of a transistor portion to be changed.

In an example of the configuration shown in FIG. 1, the resistance elements are inserted in series with the transistors of the driver 2. The ON resistance of a transistor and the resistance value of a resistance element may be selected from various values. A driver section having a linear I-V characteristic is realized by combination of those described. For example, a driver section having a linear I-V characteristic is realized by combining an ON resistance of a transistor, which is lower than a target ON resistance value (resistance value targeted) of a driver section, with a resistance element.

Figure 2:
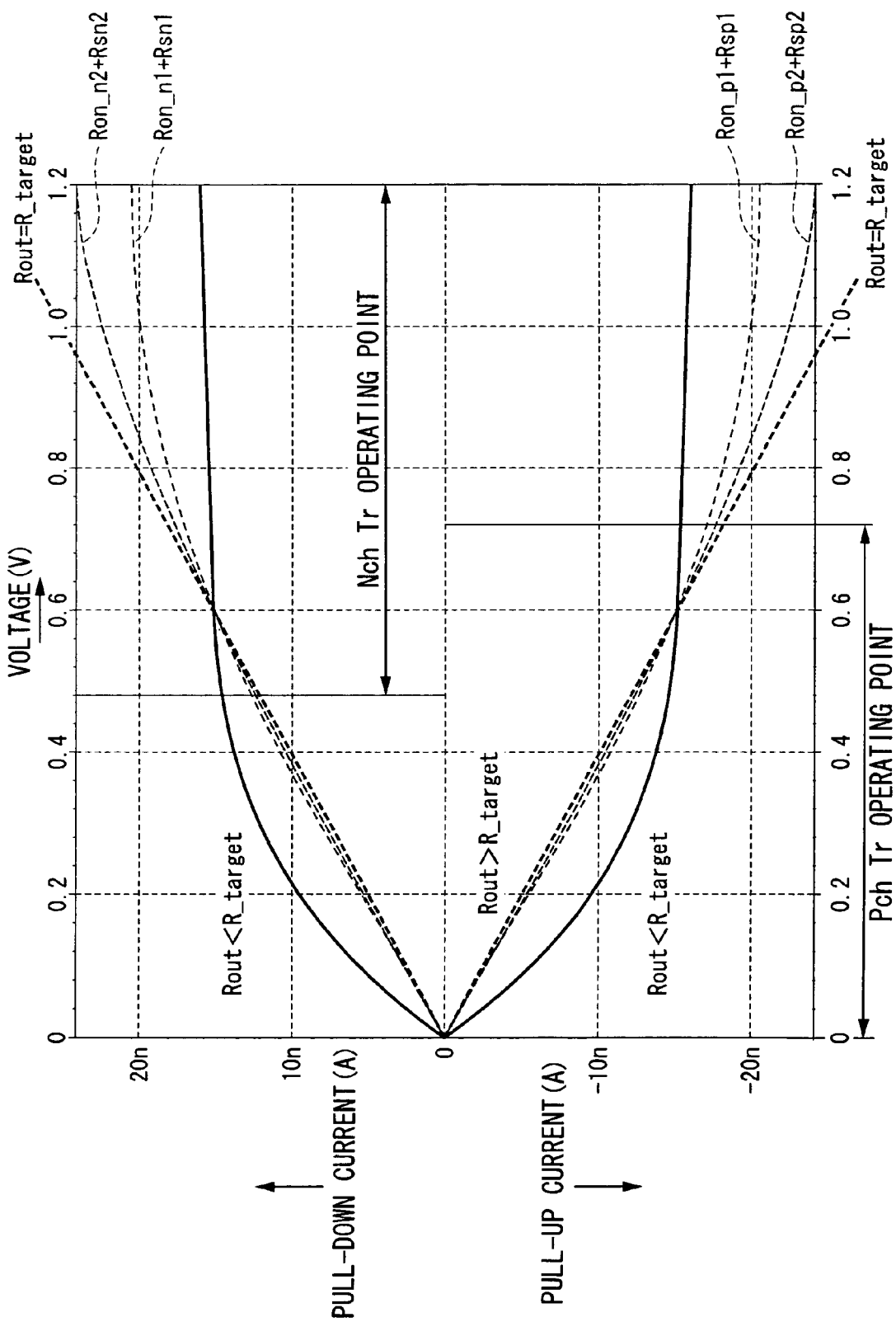
FIG. 2 is a current-voltage graph showing operating points of a Pch transistor and an Nch transistor.

FIG. 2 is a view regarding operating points of a Pch transistor and an Nch transistor.

For the Nch transistor on the pull-down side, output resistance Rout is brought close to a characteristic (linear characteristic) of a target resistor R_target. Therefore, the Nch transistor N1 (ON resistance value is Ron_n1) and the resistance element Rsn1 are selected (Rout=Ron_n1+Rsn1) or the Nch transistor N2 (ON resistance value is Ron_n2) and the resistance element Rsn2 are selected (Rout=Ron_n2+Rsn2). In this case, more reliable linearity is achieved by selecting the Nch transistor N2 and the resistance element Rsn2 (Rout=Ron_n2+Rsn2), as shown in FIG. 2.

Similarly, for the Pch transistor on the pull-up side, output resistance Rout is brought close to a characteristic (linear characteristic) of a target resistor R_target. Therefore, the Pch transistor P1 (ON resistance value is Ron_p1) and the resistance element Rsp1 are selected (Rout=Ron_p1+Rsp1) or the Pch transistor P2 (ON resistance value is Ron_p2) and the resistance element Rsp2 are selected (Rout=Ron_p2+Rsp2). In this case, more reliable linearity is achieved by selecting the Pch transistor P2 and the resistance element Rsp2 (Rout=Ron_p2+Rsp2).

Regarding the combination of ON resistance of a transistor and a resistance value of a resistance element, there is a relationship of trade-off between to what extent the linear characteristic is to be realized and an impact of an increase in transistor size (W size) for realizing low ON resistance of a transistor upon design.

For example, there is a relationship of 'RON_n1>RON_n2' and 'Rsn1<Rsn2' in the example shown in FIG. 2. In order to realize a driver section with an I-V characteristic which is more linear by selecting the Nch transistor N2 and the resistance element Rsn2, a larger transistor size (W size) is needed.

In a case where a sum of the ON resistance of the transistor and the resistance value of the resistance element is selected to be larger than a target ON resistance value of the driver section, it is thought that the target ON resistance value of a practical driver section is in a range of about several tens of ohms to several hundreds of ohms.

In the configuration shown in FIG. 1, an example in which a transistor to be driven is selected by arbitrarily changing a gate level of each transistor using the driving transistor selecting section 3 has been shown. A fuse or an antifuse may be used as a means for selecting a transistor and a resistance element.

As described above, in the first embodiment of the invention, the Pch transistor on the pull-up side and the resistance element and the Nch transistor on the pull-down side and the resistance element are selected by the driving transistor selecting section 3. Accordingly, since a driver section with the linear I-V characteristic can be provided, a signal transmission characteristic can be improved. The driver section with the linear I-V characteristic can be controlled to be adapted to various conditions. Therefore, even if a termination resistance value or a reference voltage VRef value changes, an ON resistance value on a side of an optimal driver transistor with a linear characteristic can be determined arbitrarily. Since the symmetric property of an Eye pattern can be secured even if a termination condition or the reference voltage VRef value changes, a problem whereby a window width on the low side becomes narrow can be solved.

Second Embodiment

Figure 3:
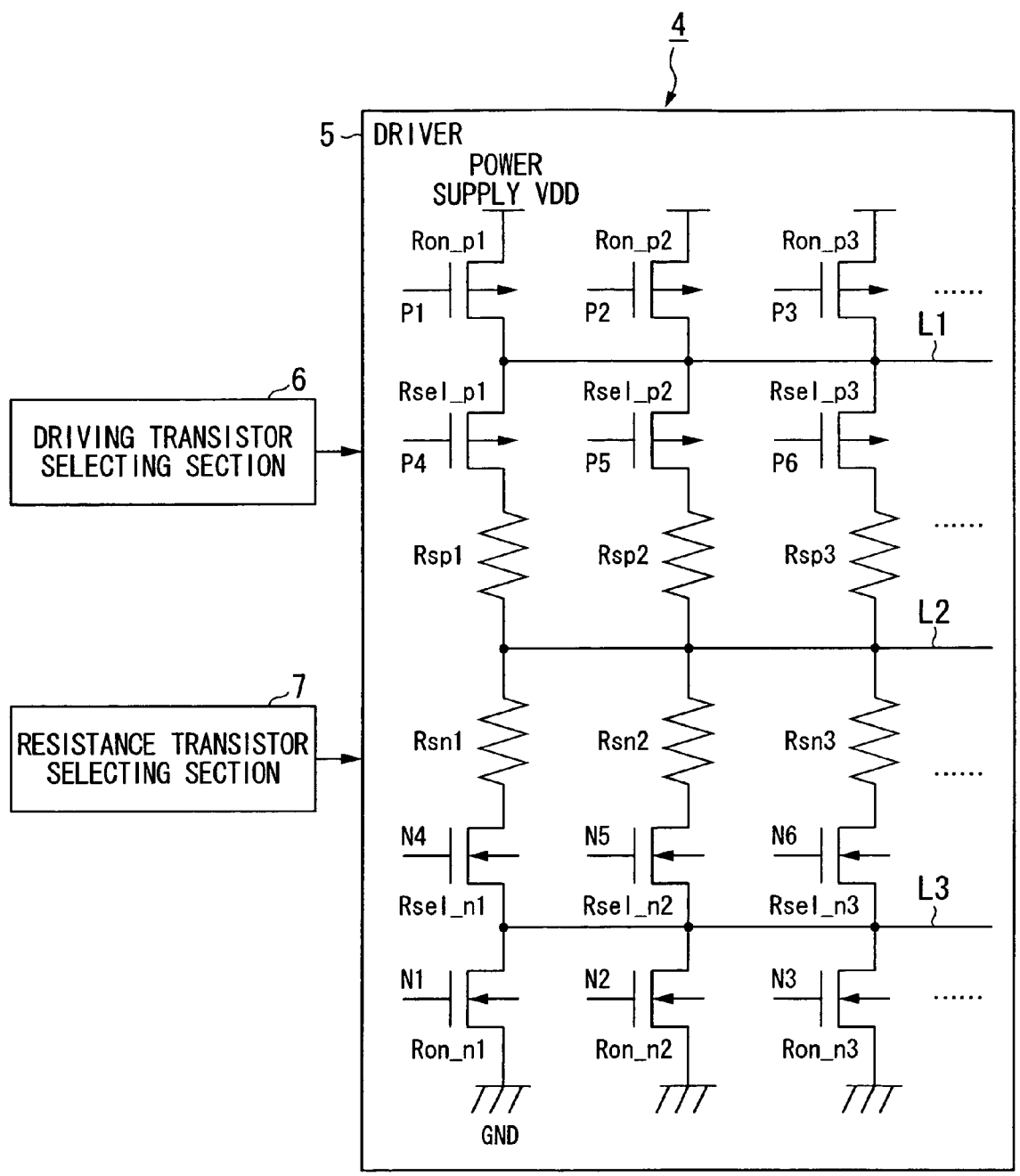
FIG. 3 is a circuit diagram showing a configuration of a semiconductor device according to a second embodiment of the present invention.

FIG. 3 is a view showing the configuration of a semiconductor device according to a second embodiment of the invention and is a view showing the configuration of a driver section.

A driver section 4 shown in FIG. 3 is configured to include a driver 5, a driving transistor selecting section 6, and a resistance transistor selecting section 7.

The driver section 4 has Pch transistors (Pch MOSFETs) P1, P2, and P3 (which have different ON resistance values) on the pull-up side and Pch transistors P4, P5 and P6 for selection of resistance elements. The driver section 4 has Nch transistors (Nch MOSFETs) N1, N2, and N3 (which have different ON resistance values) on the pull-down side and Nch transistors N4, N5 and N6 for selection of resistance elements. The Pch transistors P1, P2, and P3 are Pch transistors having different ON resistance values (may have the same ON resistance value). The Nch transistors N1, N2, and N3 are Nch transistors having different ON resistance values (may have the same ON resistance value).

Sources of the Pch transistors P1, P2, and P3 on the pull-up side are connected to a power supply VDD, and sources of the Nch transistor N1, N2, and N3 on the pull-down side are connected to the ground (GND).

A source of the Pch transistor P4 is connected to a drain of the Pch transistor P1, and the Pch transistors P1 and P4 are connected in series. A resistance element Rsp1 is connected to a drain of the Pch transistor P4. A source of the Pch transistor P5 is connected to a drain of the Pch transistor P2, and the Pch transistors P2 and P5 are connected in series. A resistance element Rsp2 is connected to a drain of the Pch transistor P5. A source of the Pch transistor P6 is connected to a drain of the Pch transistor P3, and the Pch transistors P3 and P6 are connected in series. A resistance element Rsp3 is connected to a drain of the Pch transistor P6. The resistance elements Rsp1, Rsp2, and Rsp3 are resistance elements having different resistance values (may have the same resistance value).

A connection point of the Pch transistors P1 and P4, a connection point of the Pch transistors P2 and P5, and a connection point of the Pch transistors P3 and P6 are commonly connected by a signal line L1.

On the other hand, a drain of the Nch transistor N1 and a source of the Nch transistor N4 are connected, and the Nch transistors N1 and N4 are connected in series. A resistance element Rsn1 is connected to a drain of the Nch transistor N4. A drain of the Nch transistor N2 and a source of the Nch transistor N5 are connected, and the Nch transistors N2 and N5 are connected in series. A resistance element Rsn2 is connected to a drain of the Nch transistor N5. A drain of the Nch transistor N3 and a source of the Nch transistor N6 are connected, and the Nch transistors N3 and N6 are connected in series. A resistance element Rsn3 is connected to a drain of the Nch transistor N6. The resistance elements Rsn1, Rsn2, and Rsn3 are resistance elements having different resistance values (may have the same resistance value).

A connection point of the Nch transistors N1 and N4, a connection point of the Nch transistors N2 and N5, and a connection point of the Nch transistors N3 and N6 are commonly connected by a signal line L3.

The resistance element Rsp1 and the resistance element Rsn1 are connected in series, the resistance element Rsp2 and the resistance element Rsn2 are connected in series, the resistance element Rsp3 and the resistance element Rsn3 are connected in series, and connection points thereof are commonly connected by a signal line L2 (equivalent to a data transmission line).

In the drawing, a reference numeral Ron_p1 denotes an ON resistance value of the Pch transistor P1, a reference numeral Ron_p2 denotes an ON resistance value of the Pch transistor P2, and a reference numeral Ron_p3 denotes an ON resistance of the Pch transistor P3. A reference numeral Rsel_p4 denotes an ON resistance value of the Pch transistor P4, a reference numeral Rsel_p5 denotes an ON resistance value of the Pch transistor P5, and a reference numeral Rsel_p6 denotes an ON resistance value of the Pch transistor P6. A reference numeral Ron_n1 denotes an ON resistance value of the Nch transistor N1, a reference numeral Ron_n2 denotes an ON resistance value of the Nch transistor N2, and a reference numeral Ron_n3 denotes an ON resistance of the Nch transistor N3. A reference numeral Rsel_n4 denotes an ON resistance value of the Nch transistor N4, a reference numeral Rsel_n5 denotes an ON resistance value of the Nch transistor N5, and a reference numeral Rsel_n6 denotes an ON resistance value of the Nch transistor N6.

In the above configuration, the driving transistor selecting section 3 selects a transistor for driving the data transmission line by arbitrarily changing gate levels of the Pch transistors P1, P2, and P3 on the pull-up side. Thus, the ON resistance value of the transistor portion on the pull-up side can be changed.

The driving transistor selecting section 3 selects a transistor for driving the data transmission line by arbitrarily changing gate levels of the Nch transistors N1, N2, and N3 on the pull-down side. Thus, the ON resistance value of the transistor portion on the pull-down side can be changed.

The resistance transistor selecting section 7 selects one of the resistance elements Rsp1, Rsp2, and Rsp3 by arbitrarily changing gate levels of the transistors P4, P5, and P6 to select a transistor. The resistance transistor selecting section 7 selects one of the resistance elements Rsn1, Rsn2, or Rsn3 by arbitrarily changing gate levels of the transistors N4, N5, and N6 to select a transistor.

Thus, on the pull-up side of the driver 5, the ON resistance value is set by selecting a Pch transistor from the Pch transistors P1, P2, and P3. The resistance value of a resistance element is set by selecting a Pch transistor from the Pch transistors P4, P5, and P6. On the pull-down side, the ON resistance value is set by selecting an Nch transistor from the Nch transistors N1, N2, and N3. The resistance value of a resistance element is set by selecting an Nch transistor from the Nch transistor N4, N5, and N6.

In this manner, in a semiconductor device, a driver section with the linear I-V characteristic can be provided. Accordingly, a signal transmission characteristic can be improved and the driver section with the linear I-V characteristic can be controlled to be adapted to various conditions. Therefore, even if a termination resistance value or a reference voltage VRef value changes, an ON resistance value on a side of an optimal driver transistor with a linear characteristic can be determined arbitrarily. Since the symmetric property of an Eye pattern can be secured even if a termination condition or the reference voltage VRef value changes, a problem that a window width on the low side becomes narrow can be solved.

In the configuration shown in FIG. 3, an example in which a resistance element is selected by arbitrarily changing a gate level of each transistor using the resistance transistor selecting section 7 has been shown. A fuse or an antifuse may be used as a means for selecting a resistance element.

The above-described Pch transistors P1, P2, and P3 correspond to a first group of Pch transistors, and the above-described Pch transistors P4, P5, and P6 correspond to a second group of Pch transistors. The above-described Nch transistors N1, N2, and N3 correspond to a third group of Nch transistors, and the above-described Nch transistors N4, N5, and N6 correspond to a fourth group of Nch transistors.

Third Embodiment

In the first and second embodiments, examples in which a semiconductor manufacturer suitably selects the optimal combination of transistors and resistance elements from a resistance value of a termination resistor Rtt and the reference voltage VRef value have been described. In a third embodiment of the invention, an example of the configuration having a function of making an adjustment such that the ON resistance of a driver section output becomes optimal will be described.

A resistance value of the termination resistor Rtt changes with a characteristic impedance of a data transmission line which connects a receiver with a driver section. From a point of view of a reduction in current consumption, there is a case where a termination resistance value is set high in a range in which a problem does not occur even if the waveform quality deteriorates a little.

The reference voltage VRef depends on the performance of the receiver. In the interface having the same power supply voltage, a reference voltage level may have a unique value. Under such a background, a semiconductor manufacturer may suitably decide the ON resistance value of the driver section so that the ON resistance value is optimally set, like the first and second embodiments. In the third embodiment of the invention, an example of the configuration having a function capable of adjusting the ON resistance value of the driver section from the resistance value of the termination resistor Rtt and the reference voltage VRef in such a manner that a 'margin between a low level and the reference voltage VRef' becomes equal to a 'margin between a high level and the reference voltage VRef' will be described.

Figure 4:
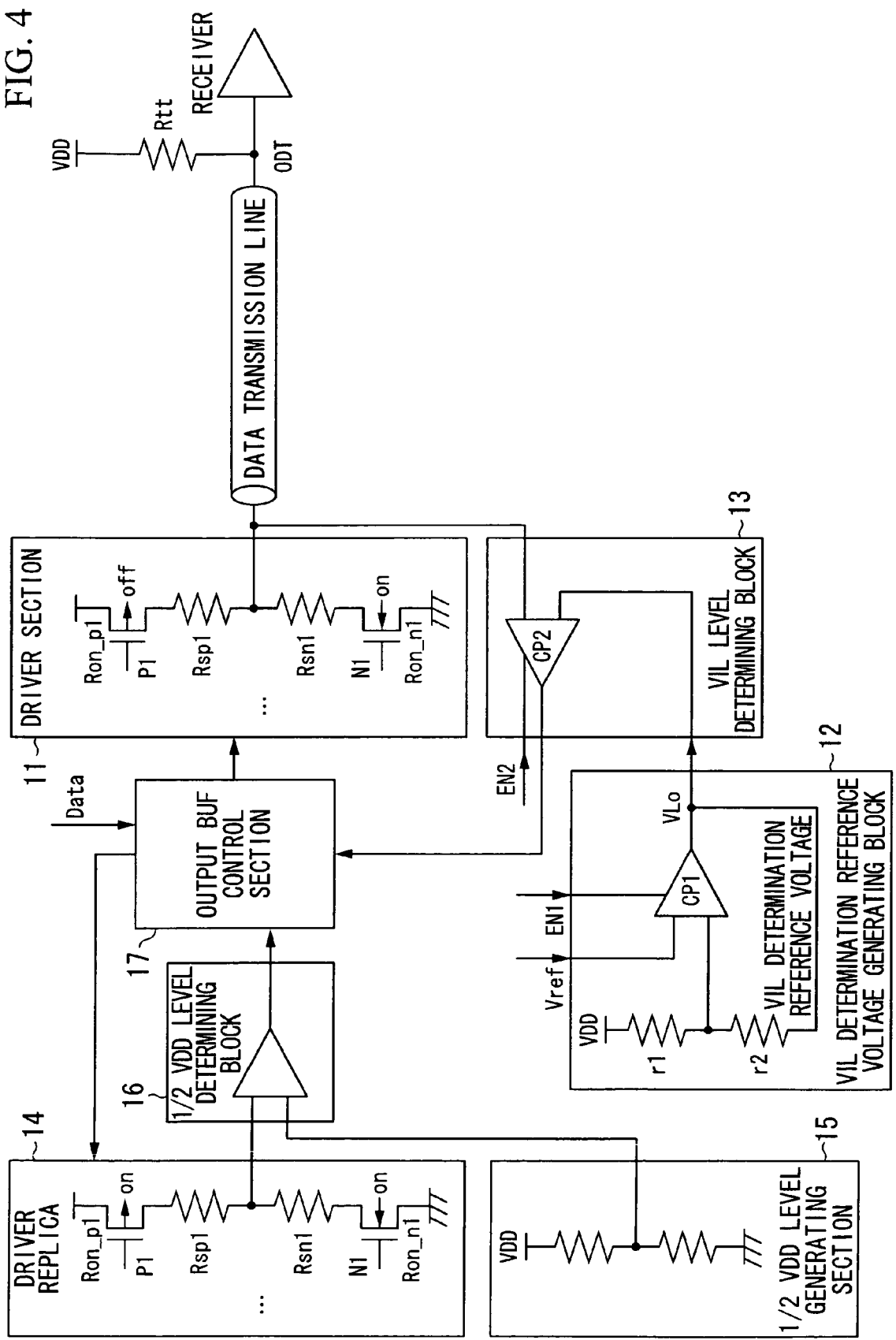
FIG. 4 is a circuit diagram showing a configuration of a semiconductor device according to a third embodiment of the present invention.

FIG. 4 is a view showing the configuration of a semiconductor device according to the third embodiment of the invention. This is an example when the receiver does not have an ODT (on-die termination) function.

In the example shown in FIG. 4, a driver section 11 having a configuration shown in FIG. 1 or 3 and a VIL determination reference voltage generating block 12 which generates a 'VIL determination reference voltage VLo' are shown. The 'VIL determination reference voltage VLo' determines a low level from the power supply voltage VDD and the reference voltage VRef in such a manner that the 'margin between the low level and the reference voltage VRef' becomes equal to the 'margin between the high level and the reference voltage VRef'.

The driver section 11 further has a VIL level determining block 13 which compares a low level of a signal, which is determined by a resistance value of the termination resistor Rtt and an ON resistance value on an Nch side of the driver section 11, with the VIL determination reference voltage VLo generated in the VIL determination reference voltage generating block 12.

The driver section 11 further has a driver replica 14 for calculating an ON resistance value on the Pch side equivalent to the ON resistance value on the Nch side of the driver section 11 on the basis of the ON resistance value on the Nch side of the driver section 11, a ½ VDD level generating section 15, and a ½ VDD level determining block 16.

The driver section 11 further has an output BUF control section 17 which reflects a result of the VIL level determining block 13 or the ½ VDD level determining block 16 and is able to adjust the ON resistance value of the driver section 11 or the driver replica 14 in the methods described in the first and second embodiments.

(Explanation on Procedures of Adjusting an ON Resistance Value on the Nch Side)

Next, a method of adjusting the ON resistance on the Nch side of the driver section 11 according to the resistance value of the termination resistor Rtt in such a manner that the 'margin between the low level and the reference voltage VRef' becomes equal to the 'margin between the high level and the reference voltage VRef' will be described.

In an adjustment procedure, at the time of low level output of the driver section 11, resistance values of an Nch transistor and a resistance element connected to the Nch transistor are adjusted and an ON resistance value is decided such that the 'margin between the low level and the reference voltage VRef' becomes equal to the 'margin between the high level and the reference voltage VRef'. Then, at the time of high level output of the driver section 11, resistance values of a Pch transistor and a resistance element connected to the Pch transistor are adjusted to the same ON resistance value as the low level output side of the driver section 11. The procedures are described below.

As a first procedure, a VIL determination reference voltage is generated.

The low level at which the 'margin between the low level and the reference voltage VRef' becomes equal to the 'margin between the high level and the reference voltage VRef' refers to a level at which an intermediate voltage of the power supply voltage VDD and the low level become equal to the reference voltage VRef. The low level is generated by the VIL determination reference voltage generating block 12.

As a method of generating the low level, the power supply voltage VDD and the VIL determination reference voltage are divided by resistance elements r1 and r2 (r1=r2) and it is compared whether or not the voltage-divided level is equal to the reference voltage VRef by using a comparator CP1. Then, the VIL determination reference voltage VLo is generated in such a manner that the voltage-divided level of the power supply voltage VDD and the VIL determination reference voltage becomes equal to the reference voltage VRef.

As a second procedure, the low output level of the driver section 11 is determined.

After generating the VIL determination reference voltage VLo by the VIL determination reference voltage generating block 12, the VIL determination reference voltage VLo and the low output level of the driver section are compared by a comparator CP2 in the VIL level determining block 13. Based on the result, the output BUF control section 17 adjusts the ON resistance value on the Nch side of the driver section 11 using the methods described in the first and second embodiments. This operation is repeated until the low output level of the driver section becomes equal to the VIL determination reference voltage VLo.

As a third procedure, resistance values of the Pch transistor and the resistance element connected to the Pch transistor are adjusted on the basis of the ON resistance value on a side of the Nch transistor calculated in the procedure 2. The driver replica 14 is used for adjustment of the resistance values of the Pch transistor and the resistance element connected to the Pch transistor.

After completing the adjustment of the resistance values of the Nch transistor and the resistance element connected to the Nch transistor of the driver section, the ON resistance value of the Pch transistor and the resistance element connected to the Pch transistor is adjusted to become equal to the ON resistance value.

Accordingly, setting of the Nch transistor and the resistance element connected to the Nch transistor of the driver replica 14 is performed so as to be the same as the driver section 11 by the output BUF control section 17.

The voltage-divided level decided by the ON resistance on the Nch side and the ON resistance on the Pch side of the driver replica 14 and the ½ VDD level generated in the ½ VDD level generating section 15 are compared by the ½ VDD level determining block 16.

Based on the result, the output BUF control section 17 adjusts the resistance values of the Pch transistor of the driver replica 14 and the resistance element connected to the Pch transistor.

This operation is repeated until the voltage-divided level decided by the ON resistance value on the Nch side of the driver replica 14 and the ON resistance value on the Pch side becomes equal to the ½ VDD level.

Thus, in the third embodiment of the invention, a resistance value of the termination resistor Rtt which may change with a characteristic impedance of a transmission line and the like or an ON resistance value of the driver section which is decided by the reference voltage VRef value depending on the performance of the receiver may be suitably adjusted. In addition, the ON resistance value of the driver section may be set in such a manner that the 'margin between the low level and the reference voltage VRef of a driver section output' becomes equal to the 'margin between the high level and the reference voltage VRef of the driver section output'.

Fourth Embodiment

In the third embodiment, the example in which the receiver side does not have the ODT function has been described. In a fourth embodiment of the invention, an example of the case in which the receiver side has the ODT function will be described.

Figure 5:
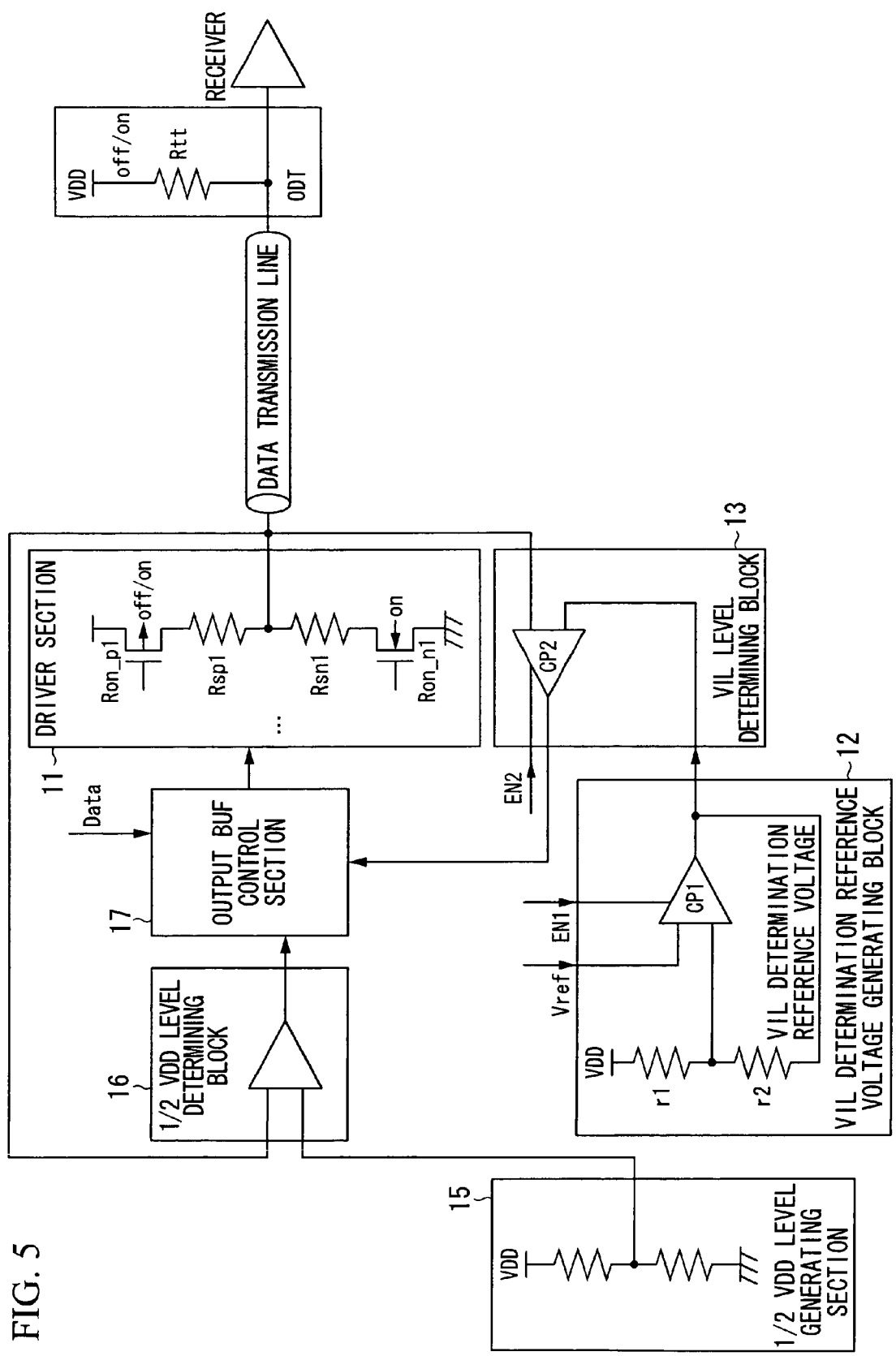
FIG. 5 is a circuit diagram showing a configuration of a semiconductor device according to a fourth embodiment of the present invention.
Figure 6:
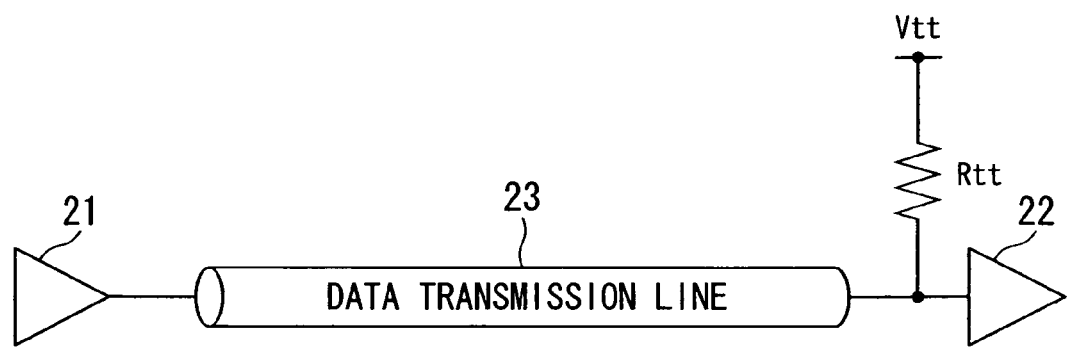
FIG. 6 is a schematic diagram explaining data transmission using a driver and a receiver.
Figure 7A:
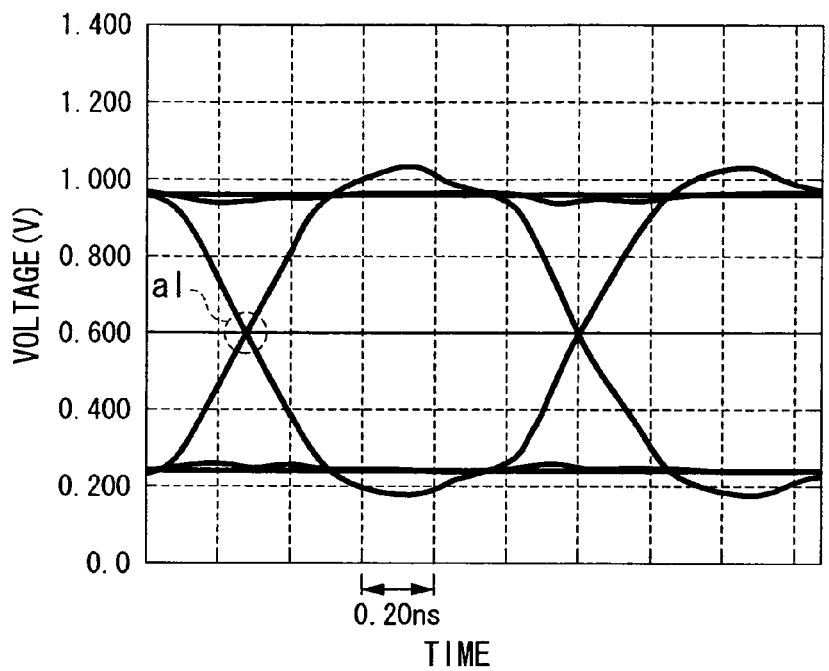
FIG. 7A is a time chart showing an example of an Eye pattern in a data transmission line, which indicates a case where a Vtt level is set to ½ of a power supply voltage.
Figure 7B:
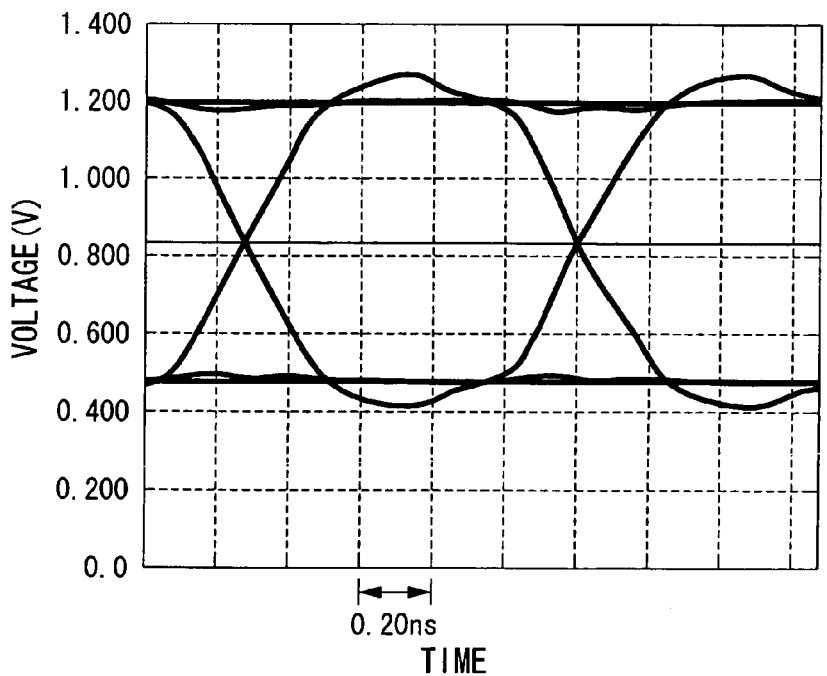
FIG. 7B is a time chart showing an example of an Eye pattern in the data transmission line, which indicates a case where the Vtt level is set to the power supply voltage.
Figure 8:
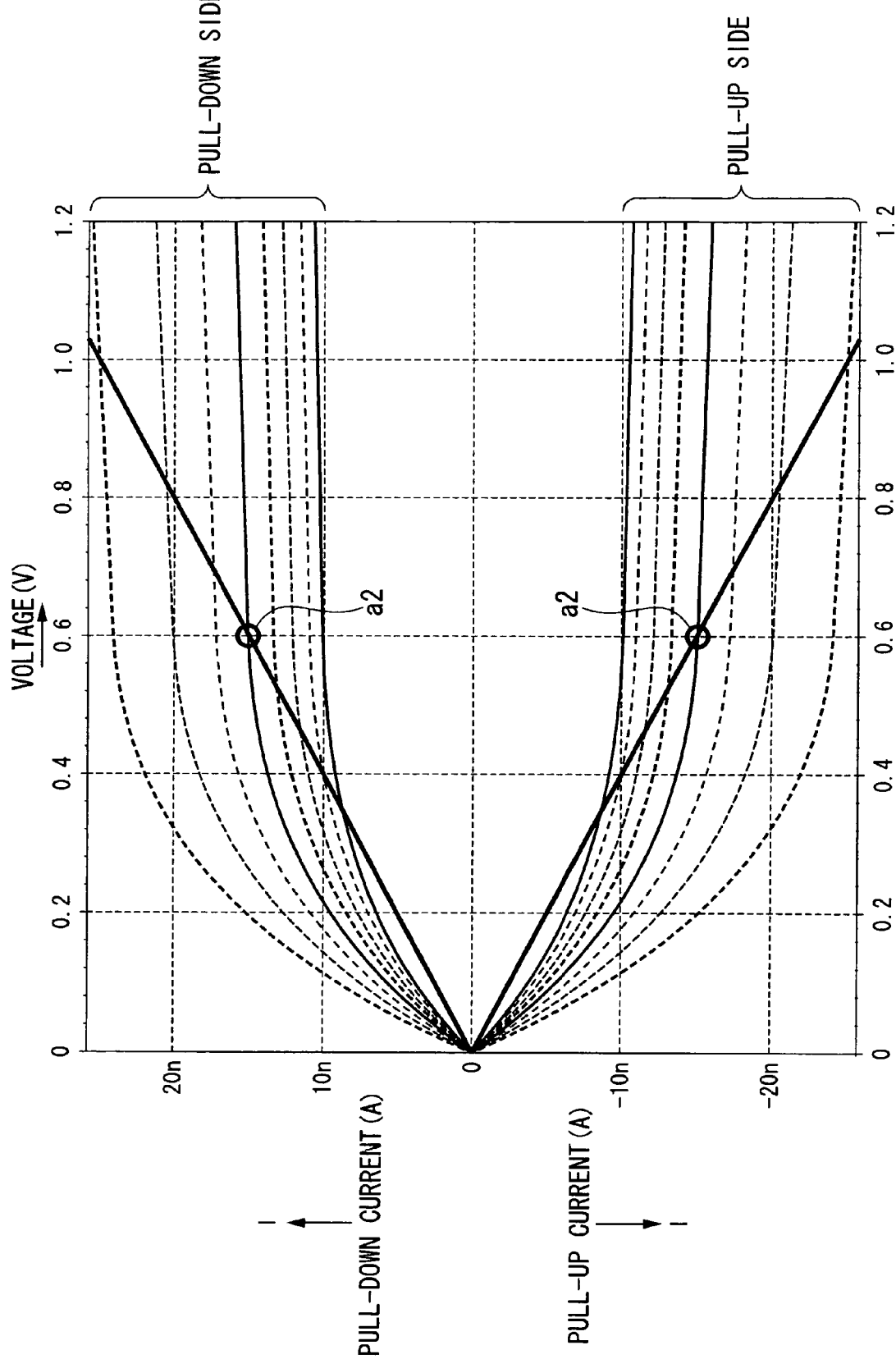
FIG. 8 is a current-voltage graph showing the relationship between pull-up/pull-down current and voltage in a driver (I-V characteristic)
Figure 9A:
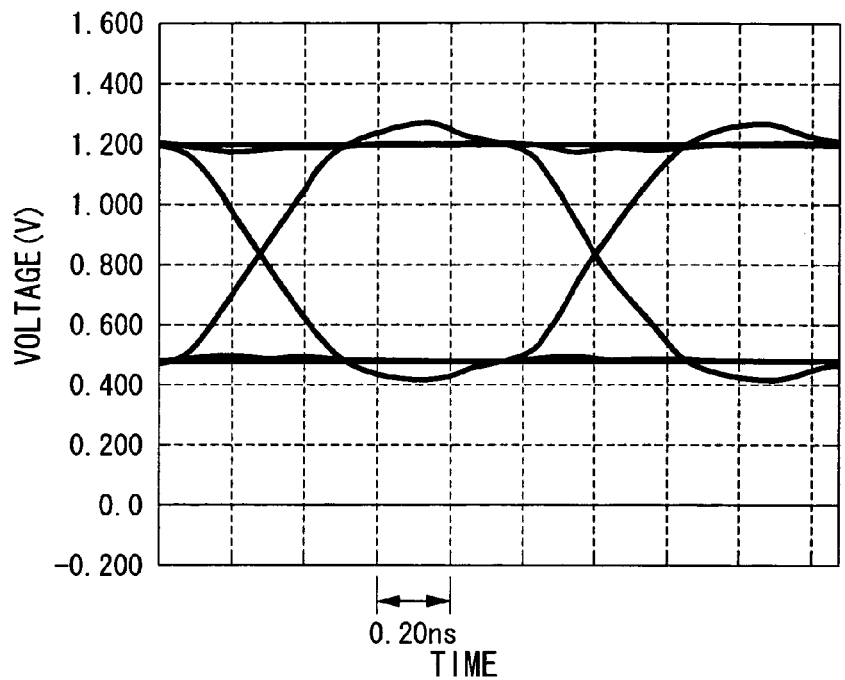
FIG. 9A is a time chart showing an example of an Eye pattern in a resistance element model.
Figure 9B:
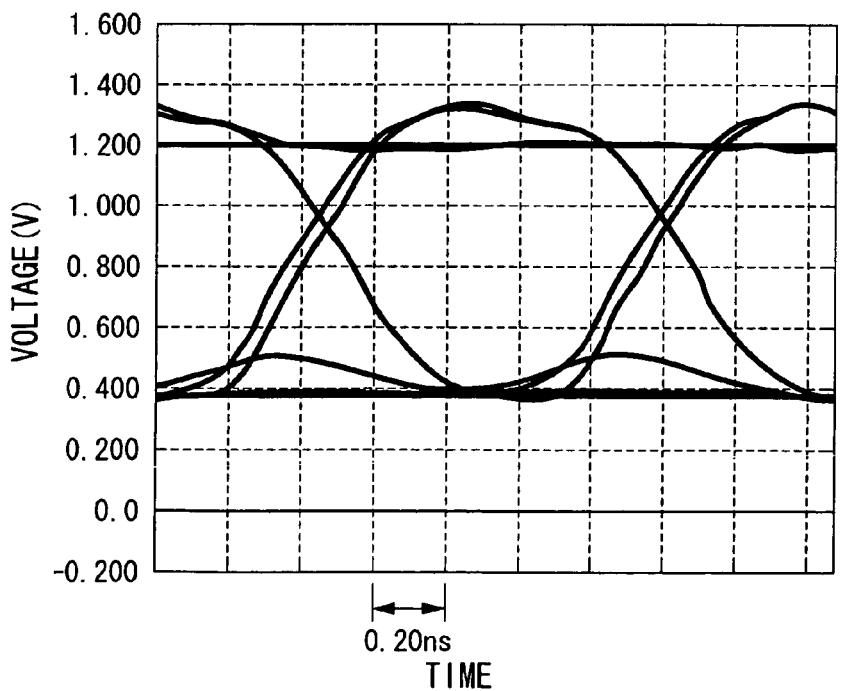
FIG. 9B is a time chart showing an example of an Eye pattern in a transmit model.
Figure 10A:
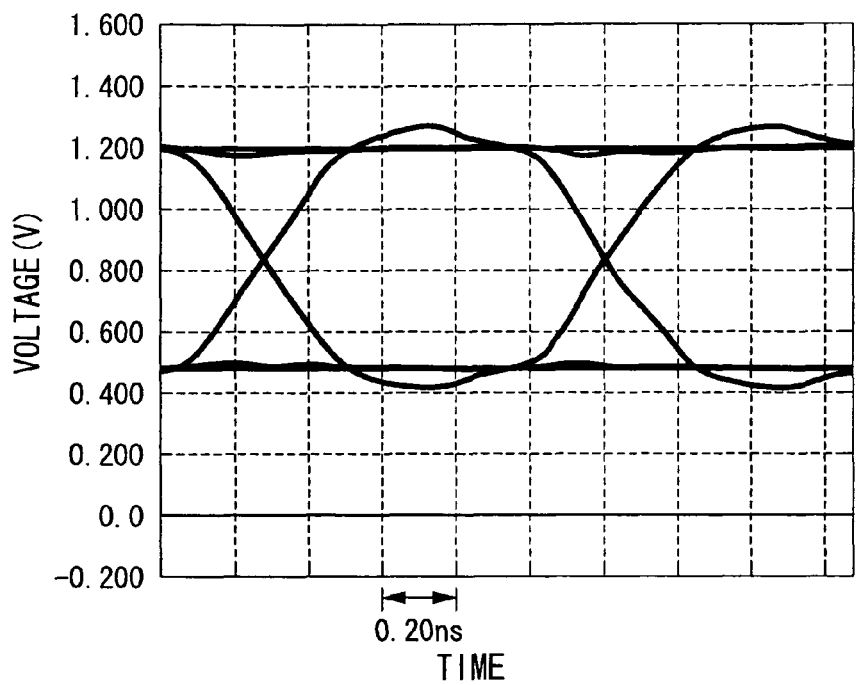
FIG. 10A is a time chart showing an example of an Eye pattern in a resistance element model when a resistance value of a termination resistor is set small.
Figure 10B:
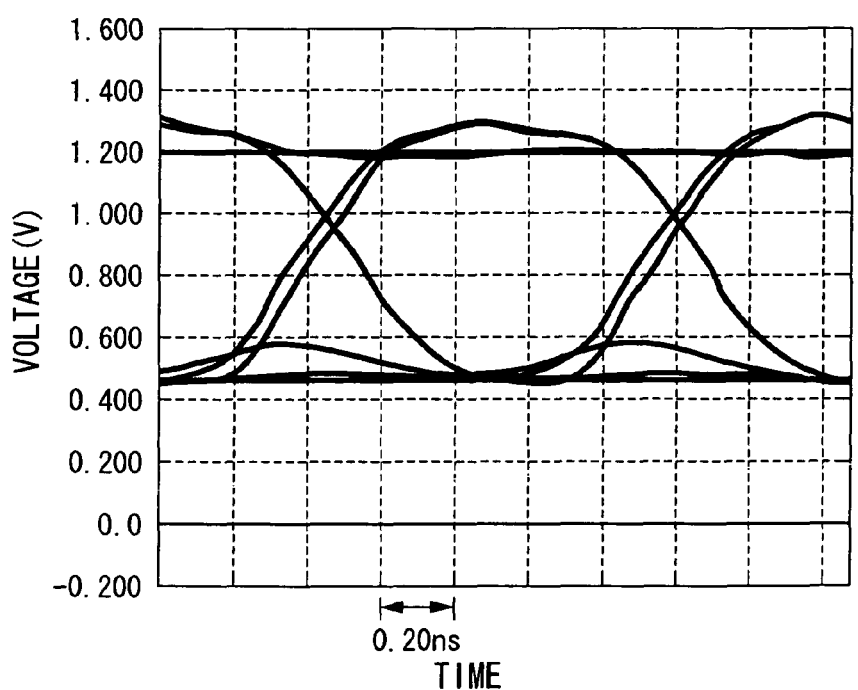
FIG. 10B is a time chart showing an example of an Eye pattern in a transistor model when the resistance value of the termination resistor is set small.

FIG. 5 is an example of the configuration in the case where the receiver side has the ODT function. The basic configuration and operation are the same as those in the configuration example shown in FIG. 4. The driver replica 14 shown in FIG. 4 can be omitted by turning ON/OFF the ODT function on the receiver side.

In the case of adjusting resistance values of an Nch transistor and a resistance element connected to the Nch transistor, the same procedure as in the example shown in FIG. 4 is performed.

In the case of adjusting resistance values of a Pch transistor and a resistance element connected to the Pch transistor, the ODT is turned OFF first.

Then, a voltage-divided level decided by the ON resistance on the Nch side and the ON resistance on the Pch side of the driver section 11 and the ½ VDD level are compared by the ½ VDD level determining block 16. The output BUF control section 17 repeats adjustment of the ON resistance on the Pch side until the voltage-divided value becomes equal to the ½ VDD level. Thus, the ON resistance value on the Pch transistor side and the value of the resistance element can be set without using a driver replica.

(Explanation of a Specific Example)

As the specific example, the reference voltage VRef is 0.84 V when a power supply voltage is set to 1.2 V and the reference voltage VRef is set to 0.7 times the power supply voltage. The 'margin between the high level and the reference voltage VRef' is set to '1.2 V−0.84 V=0.36 V'. The low level at which the 'margin between the low level and the reference voltage VRef' becomes equal to the 'margin between the high level and the reference voltage VRef' needs to be set to '0.84 V−0.36 V−0.48 V'.

At this time, the target ON resistance value of the driver section depends on a termination resistance value on the receiver side. For example, when the termination resistance value is 60Ω, the target ON resistance of the driver section becomes 40Ω.

The low level becomes lower than 0.48 V targeted when the ON resistance value of the driver section is lower than the target ON resistance value and becomes higher than 0.48 V targeted when the ON resistance value of the driver section is higher than the target ON resistance value.

Although realizing the target ON resistance of 40Ω of the driver section depends on how linear an I/O characteristic of the driver section is, values set by dividing a range of about 20Ω to 30Ω are prepared as ON resistance values of a transistor or resistance values of a resistance element, and an optimal one is selected by the above-described method.

As stated so far, the target ON resistance value of the driver section also changes with a value of the reference voltage VRef and the termination resistance value on the receiver side. In the same manner as a value in a range of about several tens of ohms to several hundreds of ohms can be realized as the target ON resistance value of a practical driver section, it is preferable that values set by dividing a range of about several tens of ohms to several hundreds of ohms in the practical unit be also prepared as the ON resistance value of a transistor or the resistance value of a resistance element.

Regarding an adjustment of the ON resistance value of the driver section, an adjustment suitable for the system is performed by performing initialize • sequence at the start of the system each time. Since the ON resistance value of a transistor also changes with a fluctuation in temperature, power supply voltage, and the like, the effect can also be acquired by performing a periodical adjustment during an actual operation.

As described above, in the semiconductor device according to the embodiment of the invention, an ON resistance value of an optimal driver transistor with a linear characteristic can be arbitrarily determined even if the termination resistance value or the reference voltage VRef value changes. Since the symmetric property of an Eye pattern can be secured even if a termination condition or the reference voltage VRef value changes, a problem that the window width on the low side becomes narrow can be solved.

Since the symmetric property of the Eye pattern can be secured by providing the driver section with a linear I-V characteristic, distortion of the window width can be reduced. The 'margin between the low level and the reference voltage VRef' can be made equal to the 'margin between the high level and the reference voltage VRef'.

A resistance value of the termination resistor Rtt which may change with a characteristic impedance of a transmission line and the like or an ON resistance value of the driver section which is decided by the reference voltage VRef value depending on the performance of the receiver may be suitably adjusted.

For the resistance value of the termination resistor Rtt which may change with a characteristic impedance of a transmission line and the like or the ON resistance value of the driver section which is decided by the reference voltage VRef value depending on the performance of the receiver, an adjustment suitable for the system may be made at the time of initialization.

Since the ON resistance value of a transistor also changes with a fluctuation in temperature, power supply voltage, and the like, the effect can also be acquired by performing a periodical adjustment of an ON resistance value during an actual operation.

As a utilization field of the semiconductor device according to the embodiment of the invention, portable devices in which a low voltage and a high speed are requested or digital devices, such as a DVD or a TV, may be mentioned.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. A semiconductor device comprising:
a driver section for transmitting data to a data transmission line in which power supply termination is made,
wherein said driver section includes:
a plurality of transistors which are provided on a pull-up side and have different ON resistance values to drive said data transmission line in a high level;
a plurality of resistance elements which are provided on said pull-up side and each of which is connected in series to each of said transistors and has one end connected to an output side of said transistor and the other end connected to said data transmission line;
a plurality of transistors which are provided on a pull-down side and have different ON resistance values to drive said data transmission line in a low level;
a plurality of resistance elements which are provided on said pull-down side and each of which is connected in series to each of said transistors and has one end connected to an output side of said transistor and the other end connected to said data transmission line; and
a driving transistor selecting section which selects any of said plurality of transistors on each of said pull-up side and said pull-down side,
wherein:
said plurality of said transistors provided on said pull-up side are P-channel transistors;
said plurality of said transistors provided on said pull-down side are N-channel transistors; and
each of said plurality of said resistance elements is connected in series to each of said N-channel transistors and has said one end connected to an output side of said N-channel transistor, and
wherein:
said plurality of said transistors include a first group of said P-channel transistors of which sources are connected to a power supply side and drains are commonly connected, a second group of said P-channel transistors for resistance element selection of which sources are connected to drain sides of said first group and drains are commonly connected to said data transmission line through resistance elements having different resistance values interposed therebetween, a third group of said N-channel transistors of which sources are connected to a ground side and drains are commonly connected, and a fourth group of said N-channel transistors for resistance element selection of which sources are connected to drain sides of said third group and drains are commonly connected to said data transmission line through resistance elements having different resistance values interposed therebetween;
said driving transistor selecting section selects any of said first group and any of said third group by changing gate levels of said transistors of said first group and said third group; and
said semiconductor device further comprises a resistance transistor selecting section which selects any of said second group and any of said fourth group to select a resistance element by changing gate levels of said transistors of said second group and said fourth group.

2. The semiconductor device according to claim 1 wherein, said resistance transistor selecting section includes a fuse or an antifuse for selecting a desired transistor from said second group and said fourth group.

3. A semiconductor device comprising:
a driver section for transmitting data to a data transmission line in which power supply termination is made,
wherein said driver section includes;
a plurality of transistors which are provided on a pull-up side and have different ON resistance values to drive said data transmission line in a hi level;
a plurality of resistance elements which are provided on said null-up side and each of which is connected in series to each of said transistors and has one end connected to an output side of said transistor and the other end connected to said data transmission line;
a plurality of transistors which are provided on a null-down side and have different ON resistance values to drive said data transmission line in a low level;
a plurality of resistance elements which provided on said pull-down side and each of which is connected in series to each of said transistors and has one end connected to an output side of said transistor and the other end connected to said data transmission line; and a driving transistor selecting section which selects any of said plurality of transistors on each of said pull-up and said pull-down side, wherein;

said plurality of said transistors provided on said pull-up side are P-channel transistors;

said plurality of said transistors provided on said pull-down side are N-channel transistors; and each of said plurality of said resistance elements is connected in series to each of said N-channel transistors and has said one end connected to an output side of said N-channel transistor, and wherein the semiconductor device further comprises:

a determination reference voltage generating block which generates a determination reference voltage used to determine a low level, at which a margin between said low level of said driver section output and a reference voltage becomes equal to a margin between a high level of said driver section output and said reference voltage, on the basis of a power supply voltage and said reference voltage;

a level determining block which compares a low level of a signal, which is determined by a resistance value of a termination resistor on a receiver side, said ON resistance value of said N-channel transistor of said driver section, and said resistance value of said resistance element connected to said N-channel transistor, with said determination reference voltage generated by said determination reference voltage generating block; and an output control section which repeats an adjustment of said ON resistance of said N-channel transistor of said driver section on the basis of a result of the comparison made by said level determining block until said low level of said driver section becomes equal to said determination reference voltage.

4. The semiconductor device according to claim 3, further comprising:

a driver replica which sets said ON resistance value on said N-channel transistor side of said driver section calculated by said output control section beforehand and calculates said ON resistance value on said P-channel transistor side equal to said ON resistance value on said N-channel transistor side;

a ½ of power supply voltage level generating section which generates a voltage of ½ level of said power supply voltage on the basis of said power supply voltage; and a ½ of power supply voltage level determining block which compares a voltage-divided level, which is determined by an ON resistance value on said N-channel transistor side and an ON resistance value on said P-channel transistor side of said driver replica, with said ½ of power supply voltage level generated by said ½ of power supply voltage level generating section, wherein said output control section adjusts said ON resistance value on said P-channel transistor side of said driver replica such that said voltage-divided level becomes said ½ of power supply voltage level on the basis of an output of said ½ of power supply voltage level determining block and adjusts said ON resistance value on said P-channel transistor side of said driver section on the basis of said ON resistance value on said P-channel transistor side of said driver replica.

5. The semiconductor device according to claim 3, further comprising:

a ½ of power supply voltage level generating section which generates a voltage of ½ level of said power supply voltage on the basis of said power supply voltage; and a ½ of power supply voltage level determining block which compares a voltage-divided level, which is determined by said ON resistance value on said N-channel transistor side and said ON resistance value on said P-channel transistor side of said driver section, with said ½ of power supply voltage level generated by said ½ of power supply voltage level generating section in an on-die termination function is OFF, wherein said driver section is a driver section in a case when said on-die termination function is given on said receiver side, and said output control section adjusts said ON resistance value on said P-channel transistor side such that said voltage-divided level becomes said ½ of power supply voltage level on the basis of an output of said ½ of power supply voltage level determining block.

* * * * *